United States Patent
Kinoshita

(10) Patent No.: US 8,621,291 B2
(45) Date of Patent: Dec. 31, 2013

(54) SEMICONDUCTOR DEVICE AND DATA PROCESSING SYSTEM INCLUDING THE SAME

(75) Inventor: Hiroto Kinoshita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 357 days.

(21) Appl. No.: 12/926,488

(22) Filed: Nov. 22, 2010

(65) Prior Publication Data

US 2011/0131446 A1 Jun. 2, 2011

(30) Foreign Application Priority Data

Nov. 27, 2009 (JP) ................................. 2009-270557

(51) Int. Cl.
*G11C 29/00* (2006.01)

(52) U.S. Cl.
USPC ........................................................ 714/711

(58) Field of Classification Search
None
See application file for complete search history.

(56) References Cited

U.S. PATENT DOCUMENTS

| | | | | |
|---|---|---|---|---|
| 4,601,019 A | * | 7/1986 | Shah et al. | 365/200 |
| 5,021,944 A | * | 6/1991 | Sasaki et al. | 365/200 |
| 5,227,999 A | * | 7/1993 | Ihara et al. | 365/200 |
| 5,373,471 A | * | 12/1994 | Saeki et al. | 365/200 |
| 5,424,987 A | * | 6/1995 | Matsui | 365/200 |
| 5,771,344 A | * | 6/1998 | Chan et al. | 714/6.32 |
| 5,787,043 A | * | 7/1998 | Akioka et al. | 365/200 |
| 5,875,194 A | * | 2/1999 | Nasu | 714/710 |
| 6,072,735 A | * | 6/2000 | Komoriya et al. | 365/200 |
| 6,122,207 A | * | 9/2000 | Koshikawa et al. | 365/200 |
| 6,442,078 B1 | * | 8/2002 | Arimoto | 365/189.08 |
| 6,496,430 B2 | * | 12/2002 | Aikawa et al. | 365/200 |
| 6,668,344 B1 | * | 12/2003 | Sakata et al. | 714/710 |
| 6,700,816 B2 | * | 3/2004 | Takahashi et al. | 365/185.07 |
| 6,707,730 B2 | | 3/2004 | Mori et al. | |
| 6,894,940 B2 | * | 5/2005 | Kono et al. | 365/205 |
| 7,304,900 B2 | | 12/2007 | Shibata et al. | |

(Continued)

FOREIGN PATENT DOCUMENTS

| | | |
|---|---|---|
| JP | 2002-298596 A | 10/2002 |
| JP | 2004-158069 A | 6/2004 |
| JP | 2006-268970 A | 10/2006 |
| JP | 2008-71407 A | 3/2008 |

OTHER PUBLICATIONS

Asakura, M.; Oishi, T.; Tomishima, S.; Hidaka, H.; Arimoto, K.; Fujishima, K.;, "A hierarchical bit-line architecture with flexible redundancy and block compare test for 256 Mb DRAM," VLSI Circuits, 1993. Digest of Technical Papers. 1993 Symposium on , vol., no., pp. 93-94, May 19-21, 1993.*

*Primary Examiner* — Daniel McMahon
(74) *Attorney, Agent, or Firm* — McGinn IP Law Group, PLLC

(57) ABSTRACT

To provide a write amplifier that is connected to bit lines, a read amplifier that is connected to the bit lines via a first switch, and a relief memory element that includes a write port that is connected to the bit lines via a second switch, and a read port that is connected to the read amplifier via a third switch. When there is a request to access a defective memory cell, during a write operation, the second switch is turned on and write data is supplied from the write amplifier to the relief memory element via the bit lines, and during a read operation, the first switch is turned off and the third switch is turned on, and then read data read from the relief memory element is supplied to the read amplifier without being routed via the bit lines.

24 Claims, 12 Drawing Sheets

(56) References Cited

U.S. PATENT DOCUMENTS

| | | |
|---|---|---|
| 7,380,161 B2 * | 5/2008 | Cordero et al. .............. 714/6.13 |
| 7,542,359 B2 | 6/2009 | Shibata et al. |
| 7,808,848 B2 | 10/2010 | Shibata et al. |
| 7,813,266 B2 * | 10/2010 | Becker et al. ................. 370/217 |
| 7,835,206 B2 * | 11/2010 | Nishioka ....................... 365/200 |
| 2008/0068918 A1 | 3/2008 | Nishioka |
| 2009/0168572 A1 * | 7/2009 | Shibata et al. ................ 365/200 |

* cited by examiner

SEMICONDUCTOR DEVICE AND DATA PROCESSING SYSTEM INCLUDING THE SAME

BACKGROUND OF THE INVENTION

1. Field of the Invention

The present invention relates to a semiconductor device and a data processing system including the same, and more particularly relates to a semiconductor device that can relieve sporadically occurring bit defects and a data processing system including the semiconductor device.

2. Description of Related Art

A memory capacity of semiconductor memory devices, represented by a DRAM (Dynamic Random Access Memory), is increasing in recent years due to progress in downsizing techniques. However, advancement in downsizing has given rise to increasing numbers of defective memory cells per chip. When a memory cell is defective, it is replaced by a redundant memory cell, and the defective address is relieved.

Generally, a defective address is stored in a fuse circuit including a plurality of program fuses. When an access request is made with respect to a defective address, a control is performed in the fuse circuit whereby a redundant memory cell is accessed instead of the defective memory cell. Such defective addresses are detected during a screening test performed at a wafer state. The program fuse is cut by irradiation of a laser beam, according to the detected defective address.

However, even after the address replacement described above, there may be sporadic occurrences of defective bits due to heat stress or the like during packaging. If the defective bits are found after packaging, address replacement by irradiation of the laser beam can no longer be performed, due to which the product will have to be regarded as defective.

To provide a solution to the above problem, a method has been proposed whereby, in addition to address replacement by irradiation of a laser beam, there is provided a defect relief circuit that can relieve a small number of defective bits found after packaging. In this method, instead of a fuse circuit that requires irradiation of the laser beam, a non-volatile storage circuit that is writable electrically is used as a storage circuit for storing defective addresses. A so-called "anti-fuse circuit" in which dielectric breakdown of an oxidized film is employed is used as such a memory circuit.

Because the number of defective bits found after packaging is very few compared to the number of defective bits found during a screening test, it is preferable that replacement is performed in units of bits instead of in units of word lines or bit lines. Japanese Patent Application Laid-open Nos. 2002-298596, 2008-71407, 2004-158069, and 2006-268970 describe such a semiconductor device that can relieve sporadic bit defects.

A semiconductor memory device described in Japanese Patent Application Laid-open No. 2002-298596 is a DRAM in which relief memory elements constituted by SRAM cells are placed in a sense amplifier array of a memory cell array to relieve sporadic bit defects.

A semiconductor memory device described in Japanese Patent Application Laid-open No. 2008-71407 is also a DRAM in which relief memory elements are connected to an output terminal of a read amplifier and an input terminal of a write amplifier to relieve sporadic bit defects.

In the semiconductor memory device described in Japanese Patent Application Laid-open No. 2008-71407, a relief circuit is placed at a previous stage to an input/output circuit (a FIFO circuit) that is connected to an external data terminal and in parallel to a main amplifier (150) that reads data from a regular memory cell (110) (FIG. 1). Furthermore, the relief circuit is placed in parallel to a write amplifier WB that writes the data to the regular memory cell (110) (FIG. 3).

In Japanese Patent Application Laid-open No. 2004-158069, there is described an arrangement whereby a relief circuit is placed within a LOGIC macro located outside of a DRAM macro (FIG. 2). Furthermore, the relief circuit is placed in parallel, via a selector, to an input/output bus (MUXOUT) that connects the DRAM macro and the LOGIC macro (FIG. 3).

In Japanese Patent Application Laid-open No. 2006-268970, there is described an arrangement whereby a first relief bit register is placed in parallel to a first read/write amplifier via a read/write bus that is connected to a DQ input/output buffer circuit.

However, in the semiconductor memory device described in Japanese Patent Application Laid-open No. 2002-298596, because the relief memory elements are placed in the sense amplifier array, it is necessary that a line and space value (L/S) of transistors, wirings, and contacts that constitute the relief memory elements is identical, respectively, to a line and space value (L/S) of transistors, wirings, and contacts that constitute the sense amplifiers, to prevent an area of the memory cell array from increasing. This can lead to an increase in the possibility of a defect occurring in the relief memory element itself. Redundant I/O circuits can be used to relieve the defect in the relief memory element. However, it is not realistic to have a defect occurring in the circuit itself that is introduced to relieve sporadic bit defects, and then having to increase the number of I/O bus to relieve the defect.

Furthermore, in the semiconductor memory device described in Japanese Patent Application Laid-open No. 2002-298596, because the relief memory elements are placed inside the memory cell array, a distance between the main amplifier (a circuit including a read amplifier and a write amplifier) and the relief memory elements can increase largely depending on a position of a memory block. Moreover, a distance of each of the relief memory elements dispersed throughout the memory block from the main amplifier greatly differs from that of the other relief memory elements. As a result, a read margin and a write margin of the main amplifier for each relief memory element differs greatly, making it necessary to vary operation timings of the main amplifier and the relief memory elements according to the position of the memory block. This makes controlling very complicated.

Furthermore, in the semiconductor memory device described in Japanese Patent Application Laid-open No. 2002-298596, when the sense amplifier and the main amplifier are connected by hierarchized data buses (for example, lower local I/O lines and upper main I/O lines) to take care of the greatly increased distances between the main amplifier and the relief memory elements, contact resistances and the like among multi-layer hierarchy degrade a time constant of the hierarchized data buses having large parasitic capacitances. This leads to a prominent difference in access margins that differ according to the position of the memory block.

Meanwhile, in the semiconductor memory device described in Japanese Patent Application Laid-open No. 2008-71407, the relief memory elements are connected to the output terminals of the read amplifiers and the input terminals of the write amplifiers. Therefore, it is necessary to connect a large number of elements to the relief memory elements, and this makes controlling complicated.

SUMMARY

In one embodiment, there is provided a semiconductor device that includes: a bit line that transmits write data to be written to a memory cell and read data read from the memory cell; a write amplifier that is connected to the bit line; a read amplifier that is connected to the bit line via a first switch circuit; a relief memory element that includes a write port and a read port, the write port being connected to the bit line via a second switch circuit, and the read port being connected to the read amplifier via a third switch circuit; and a control circuit that controls an operation of at least the first switch circuit, the second switch circuit, and the third switch circuit, wherein in response to a request to access the memory cell with a defect, the control circuit supplies the write data from the write amplifier to the relief memory element via the bit line by controlling the second switch circuit to make it electrically conductive during a write operation, and read data read from the relief memory element to the read amplifier without routing the read data via the bit line by controlling the first switch circuit to make it electrically non-conductive and controlling the third switch circuit to make it electrically conductive during a read operation.

In another embodiment, there is provided a semiconductor device that includes: a plurality of memory cells; a first bit line to which any one of the memory cells is electrically connected selectively according to a first address; a second bit line to which any one of a plurality of the first bit lines is electrically connected selectively according to a second address; a first switch circuit that is connected to the second bit line; a main amplifier that includes a first port that is connected to the second bit line, a second port that is connected to the second bit line via the first switch circuit, and a third port through which communications of input and output of data with outside of the semiconductor device are performed; a relief memory element that is provided and is accessed from the outside in place of one defective memory cell of the memory cells, the relief memory element being connected to the second bit line via a first relief route that includes a read port, and connected to the second port of the main amplifier via a second relief route that includes a write port; and a control circuit that switches an access to the memory cell to an access to the relief memory element in response to an indication that both of the first and second addresses indicating an access to the one memory cell are defective addresses, wherein when the accessed addresses are indicated as the defective addresses during a write operation, the control circuit supplies write data supplied from the outside to the relief memory element from the first port of the main amplifier via the second bit line and an activated second relief route of the write port, and when the accessed addresses are indicated as the defective addresses during a read operation, the control circuit controls the first switch circuit to make it electrically non-conductive and supplies read data from the relief memory element to the second port of the main amplifier via an activated first relief route of the read port.

In one embodiment, there is provided a data processing system that includes: the above semiconductor device; a controller that supplies an address signal for accessing a memory cell to the semiconductor device; and a bus wiring that connects the semiconductor device and the controller.

As described above, in the semiconductor device according to the present invention, a relief memory element is connected to an input terminal of a read amplifier. Accordingly, there is no need to change operation timings of a main amplifier and the relief memory element according to the position of a memory block. At the same time, the number of elements required for connecting to the relief memory element can be minimized. Furthermore, the relief memory elements are placed in a different area from a memory cell array. This obviates the necessity to keep a line and space value (L/S) of transistors, wirings, and contacts constituting the relief memory elements identical to a line and space value (L/S) of transistors, wirings, and contacts constituting sense amplifiers, thereby greatly reducing the possibility of a defect occurring in the relief memory elements themselves.

BRIEF DESCRIPTION OF THE DRAWINGS

The above features and advantages of the present invention will be more apparent from the following description of certain preferred embodiments taken in conjunction with the accompanying drawings, in which:

FIG. 7A shows a case when a hit signal HIT is not activated, and FIG. 7B shows a case when the hit signal HIT is activated (and a data mask signal DMB is deactivated);

FIG. 8A shows a case when the hit signal HIT is not activated, and FIG. 8B shows a case when the hit signal HIT is activated;

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, the present invention is based on a technical concept of enabling write data to be written from a write amplifier to a relief memory element via bit lines and a read amplifier to read data directly from the relief memory element without having to route the read data from the relief memory element via the bit lines during a relief operation. This is achieved with the write amplifier that is connected to the bit lines, the read amplifier that is connected to the bit lines via a first switch circuit, and the relief memory element that includes a write port including a second switch circuit, and a read port including a third switch circuit. During a relief operation, the write data from the write amplifier is written to the relief memory element via the bit lines due to the write port being connected to the bit lines via the second switch circuit. Similarly, due to the read port being connected to the read amplifier via the third switch circuit, and additionally the first switch circuit being made non-conductive, the read data is directly read from the relief memory element into the read amplifier without being routed via the bit lines during a relief operation. Due to this concept, with a simplified circuit configuration, collision of read data read from the relief memory element and read data read from a defective memory cell can be prevented.

Preferred embodiments of the present invention will be explained below in detail with reference to the accompanying drawings.

Figure 1:
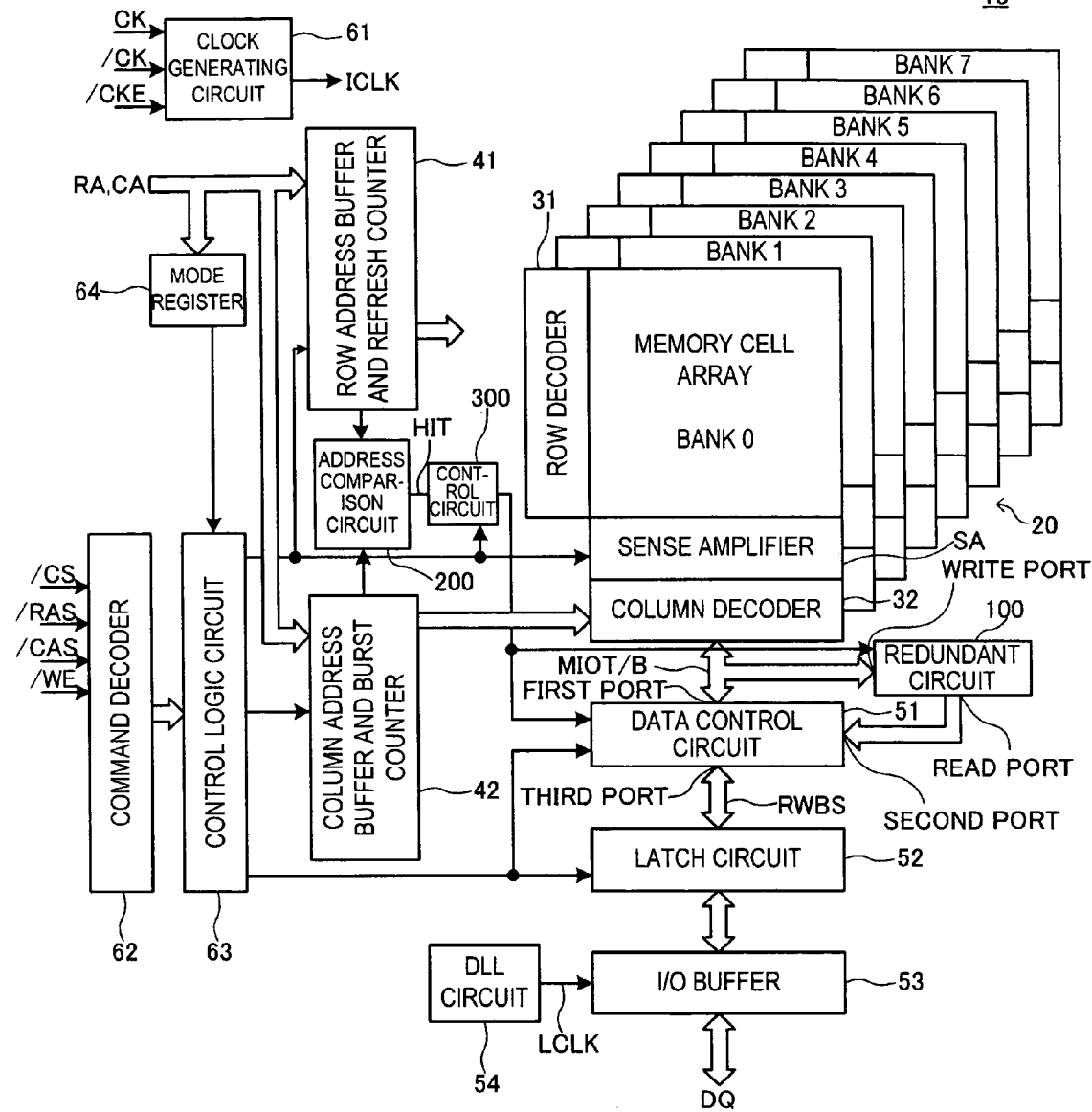
FIG. 1 is a block diagram of a semiconductor device 10 according to an embodiment of the present invention.

FIG. 1 is a block diagram of a semiconductor device 10 according to an embodiment of the present invention. Although the semiconductor device 10 is explained as a DRAM, the present invention is not limited thereto. FIG. 1 is an explanatory diagram of a connection relationship of respective blocks constituting the semiconductor device 10, and is not intended to show a layout of the semiconductor device 10.

As shown in FIG. 1, the semiconductor device 10 according to the-present embodiment includes a memory cell array 20 constituted by banks 0 to 7 that are mutually non-exclusively controlled, a row decoder 31 that selects a row series from the memory cell array 20, and a column decoder 32 that selects a column series from the memory cell array 20.

The row decoder 31 receives a row address RA from a row address buffer and refresh counter 41, and selects a word line from the memory cell array 20 based on the row address RA. The column decoder 32 receives a column address CA from a column address buffer and burst counter 42, and selects a bit line from the memory cell array 20 based on the column address CA. Thus, memory cells that correspond to the row address RA and the column address CA are selected, and the selected memory cells are connected to a data control circuit 51. The memory cells and the data control circuit 51 are connected via hierarchized bit lines (lower local I/O lines on the side of the memory cells and upper main I/O lines) described later. The bit lines among the hierarchized bit lines that are located lowermost, that is, the bit lines that are connected to the memory cells, are sometimes also called "lowermost bit lines (local bit lines)" included in the memory cell array 20. On the other hand, the bit lines among the hierarchized bit lines that are located uppermost, that is, the main I/O lines (MIOT/B), are sometimes also called "uppermost bit lines (global bit lines)" included in the memory cell array 20. The main I/O lines are connected to the data control circuit 51.

The data control circuit 51 is a circuit block that includes a main amplifier and is connected to a data input/output terminal DQ via a latch circuit 52 and an I/O buffer 53. An internal clock LCLK is supplied from a DLL circuit 54 to the I/O buffer 53, and data output is performed in synchronization with the internal clock LCLK. As explained later, the data control circuit 51 includes a first port that is connected to the uppermost bit lines (MIOT/B), a second port that is connected to "the first switch circuit connected to the uppermost bit lines", and a third port that is connected to the latch circuit 52 via a read/write bus RWBS, which is an external terminal (DQ terminal) side of the semiconductor device 10. One data control circuit 51 and one redundant circuit 100 are provided corresponding to each of the banks. A plurality of the data control circuits 51 provided corresponding to a plurality of the banks are connected to the latch circuit 52, which is common to all the banks, via a common read/write bus RWBS. Therefore, one redundant circuit 100 is provided corresponding to the data control circuit 51 provided for each bank.

Other than the above constituent elements, the semiconductor device 10 also includes a clock generating circuit 61 that receives clock signals CK and /CK, and a clock enable signal /CKE and generates various types of internal clocks ICLK, a command decoder 62 that decodes commands (/CS, /RAS, /CAS/, and /WE), a control logic circuit 63 that generates the various types of internal clocks based on an output of the command decoder 62, and a mode register 64 for setting an operation mode and the like of the semiconductor device 10.

Furthermore, the semiconductor device 10 according to the present embodiment includes the redundant circuit 100 for relieving sporadic bit defects, an address comparison circuit 200 that activates a hit signal HIT when a request to access a relief target address is detected, and a control circuit 300 that controls the data control circuits 51 and the redundant circuits 100 based on outputs of the address comparison circuit 200 and the control logic circuit 63. That is, a single redundant circuit 100 that corresponds to a single uppermost bit line possesses the function of relieving a single memory cell having a single defective bit corresponding to the row address RA and the column address CA. One redundant circuit 100 is provided for each of a plurality of the uppermost bit lines.

As explained later, each of the redundant circuits 100 is connected to the uppermost bit line via a write port, and to the second port of the data control circuit 51 via a read port. The second port is connected to the uppermost bit line via the first switch circuit described later. Furthermore, the redundant circuits 100 include relief memory elements that correspond to the uppermost bit lines, respectively. When a request to access a relief target address is detected by the address comparison circuit 200, instead of the defective memory cell, the relief memory element is connected to a corresponding data control circuit 51 via either the write port or the read port. Thus, the sporadic bit defect is relieved. The address comparison circuit 200 includes an address storage circuit for storing therein defective addresses. A non-volatile storage circuit (for example, an anti-fuse circuit) that is electrically writable and allows the defective addresses to be written thereon even after the semiconductor device 10 (a silicon chip) has been packaged by using an assembly technique is used as the address storage circuit. The control circuit 300 is a circuit that performs a control by turning on or off switch circuits of the data control circuit 51 and the redundant circuit 100 according to whether the requested access is for a write operation or a read operation and whether the hit signal HIT is activated. The details will be explained later. The term "on" indicates an electrically conductive state and the term "off" indicates an electrically non-conductive state, and these definitions hold true throughout the following descriptions.

Figure 2:
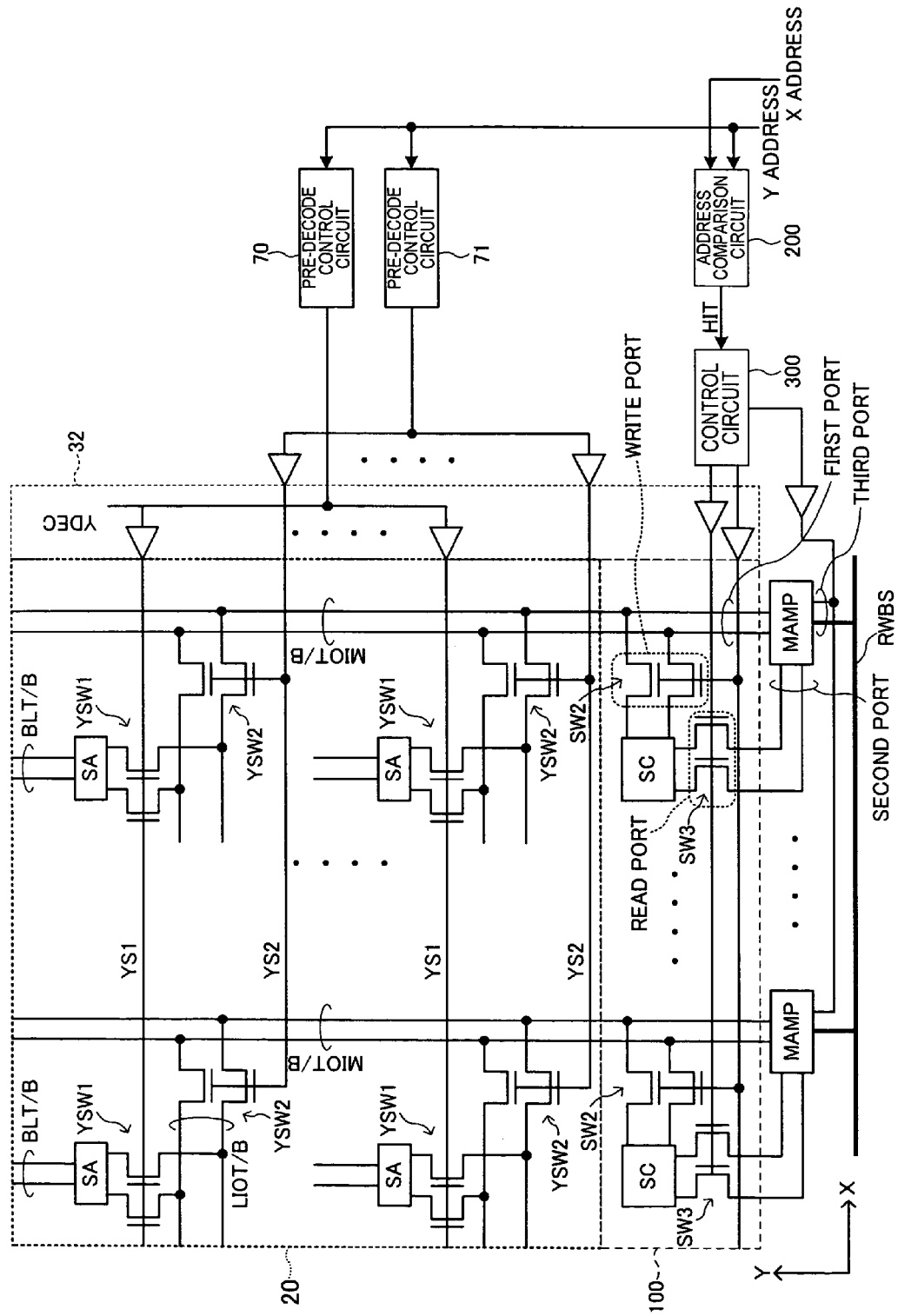
FIG. 2 is a circuit diagram of main parts of the semiconductor device 10.

FIG. 2 is a circuit diagram of main parts of the semiconductor device 10 according to the present embodiment.

As shown in FIG. 2, a plurality of pairs of bit lines BLT/B (lowermost bit lines) that is laid out along a Y direction, a plurality of pairs of local I/O lines LIOT/B (intermediate bit lines) that is laid out along an X direction, and a plurality of pairs of a main I/O lines MIOT/B (uppermost bit lines) that is laid out along the Y direction are formed in the memory cell array 20. The pairs of the bit lines BLT/B, the pairs of the local I/O lines LIOT/B, and the pairs of the main I/O lines MIOT/B are respectively formed on different wiring layers. For example, the pairs of the local I/O lines LIOT/B are laid out on a layer above that of the pairs of the bit lines BLT/B, and the pairs of the main I/O lines MIOT/B are laid out on a layer above that of the pair of the local I/O lines LIOT/B.

Figure 3:
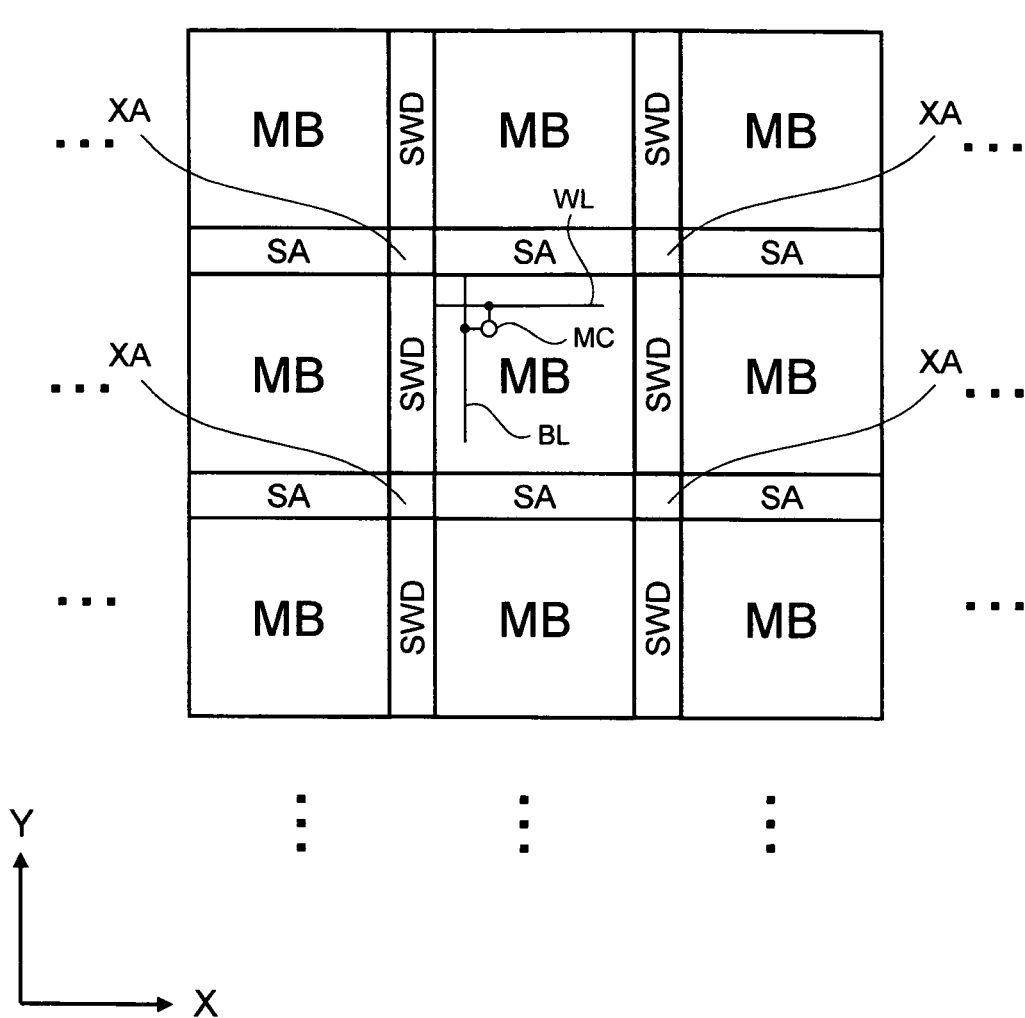
FIG. 3 is a diagram showing a configuration of memory blocks MB in a memory cell array 20.

The memory cell array 20, as shown in FIG. 3, is divided into a plurality of memory blocks MB that are laid out in the form of a matrix. A sub-word driver SWD is located between two adjacent memory blocks MB along the X direction (along an X-axis). The sub-word driver SWD selects word lines (extending along the X direction) within the memory blocks MB. A sense amplifier SA and a column switch YSW (not shown) are located between two adjacent memory blocks MB along the Y direction (along a Y-axis). With this, bit lines (extending along the Y direction) inside the memory blocks MB are driven. Thus, each of the memory blocks MB is a unit that shares the same sub-word driver SWD and the sense amplifier SA. Different pairs of the local I/O lines LIOT/B are allocated to each of the memory blocks MB. The bit lines are laid out in a lower conductive layer inside the memory blocks MB, the local I/O lines are laid out in an intermediate conductive layer in a sense amplifier array area, and the main I/O lines are laid out in an upper conductive layer in a sub-word driver array area. Thus, among the pairs of the local I/O lines, one pair is selectively connected to a corresponding pair of the main I/O lines according to an address. A plurality of the memory blocks MB that is arranged along at least the Y-axis is subjected to an exclusive control. Thus, a configuration of a hierarchized data bus is disclosed. However, the configuration is not limited thereto. For example, the main I/O lines can be laid out so as to pass through an area of the memory blocks MB.

Figure 4:
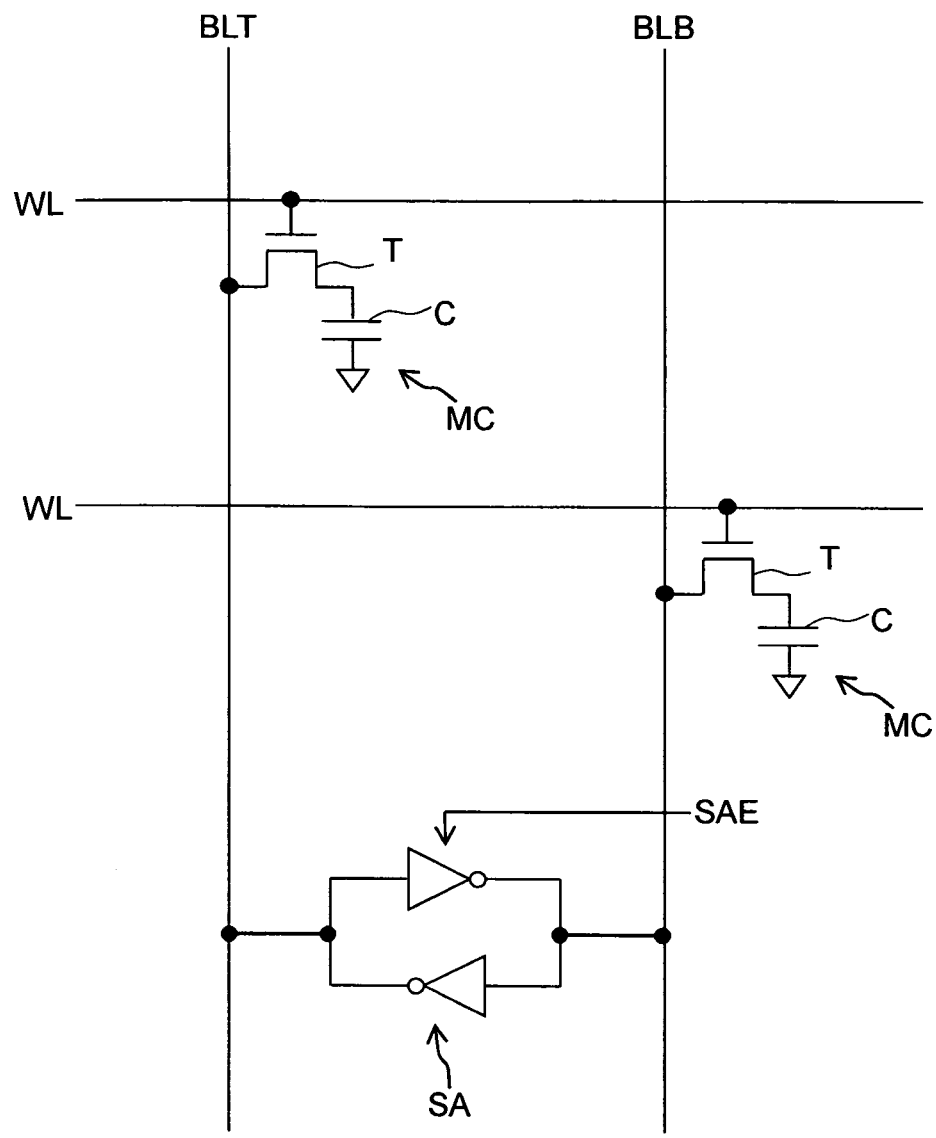
FIG. 4 is a circuit diagram showing a connection relationship between a memory cell MC and a sense amplifier SA

As shown in FIG. 4, memory cells MC are connected to each pair of the bit lines BLT/B. A potential difference occurring in each pair of the bit lines BLT/B due to an access is amplified by the sense amplifier SA. That is, the sense amplifier SA performs data communication with the memory cells MC. The sense amplifier SA accesses the memory cells MC by activating a corresponding pair of word lines WL. Activation of the word line WL is performed by the row decoder 31 shown in FIG. 1. The memory cell MC is a series circuit constituted by a cell transistor T and a cell capacitor C. A gate of the cell transistor T is connected to a corresponding word line WL, and a source and a drain of the cell transistor T are connected to the corresponding bit line BLT or the bit line BLB. The sense amplifier SA has a configuration of a voltage differential amplifying circuit and is activated in response to a sense amplifier activation signal SAE.

As shown in FIG. 2, input/output nodes of the sense amplifier SA are connected to a corresponding pair of the local I/O lines LIOT/B via a first column switch YSW1. The first column switch YSW1 is controlled by a column selection signal YS1 generated by a pre-decode control circuit 70 that receives a part of the column address CA. In this way, among a plurality of the sense amplifiers SA, some of the sense amplifiers SA selected based on the column address CA are connected to corresponding pairs of the local I/O lines LIOT/B.

Each pair of the local I/O lines LIOT/B is connected to a corresponding pair of the main I/O lines MIOT/B via a second column switch YSW2. The second column switch YSW2 is controlled by a column selection signal YS2 generated by a pre-decode control circuit 71 that receives the remaining part of the column address CA. The second column switch YSW2 is located at an intersection XA where the array of sub-word driver SWD that extends along the Y direction and the array of sense amplifiers SA that extends along the X direction cross each other (see FIG. 3). Thus, an array pitch of the second column switches YSW2 is equal to an array pitch of the memory blocks MB.

As shown in FIG. 2, the first column switch YSW1 and the second column switch YSW2 are both path gate circuits constituted by N-channel MOS transistors. Therefore, when predetermined column switches YSW1 and YSW2 are turned on, a corresponding pair of the bit lines BLT/B is directly connected to a main amplifier MAMP via the pair of the local I/O lines LIOT/B and the pair of the main I/O lines MIOT/B.

Each pair of the main I/O lines MIOT/B is connected to a first port of a corresponding main amplifier MAMP. Furthermore, each pair of the main I/O lines MIOT/B is connected to a second port via the first switch circuit described later. That is, the main amplifier MAMP is an amplifier that performs input and output operations with the memory cell array 20. (On the other hand, the sense amplifier SA is an amplifier that performs input and output operations with a single memory block MB of the memory cell array 20.) The main amplifier MAMP is provided outside of the memory cell array 20 (preferably, near an input and output point of the main I/O lines emerging from the memory cell array 20, adjacent to or near one side of the memory cell array). The main amplifier MAMP includes a read amplifier that converts a differential format of the read data into a single end format by amplification, and a write amplifier that converts the single end format of the write data into the differential format by amplification. An output of the read amplifier of the main amplifier MAMP is supplied to the read/write bus RWBS via a third port. The write data on the read/write bus RWBS (that is, data that is input from outside of the semiconductor device 10) is input to the write amplifier of the main amplifier MAMP via the third port. The read/write bus RWBS is connected to an input/output circuit (the I/O buffer 53), which is connected to the external data terminal (DQ terminal), via the latch circuit 52. A circuit configuration of the main amplifier MAMP is described later.

As shown in FIG. 2, a plurality of the redundant circuits 100 are located in an area outside of the memory cell array 20, along one side of the memory cell array 20 and between the memory cell array 20 and the main amplifiers MAMP. Specifically, the redundant circuits 100 are located corresponding to the input and output points of the pairs of the main I/O lines MIOT/B on the side of the memory cell array 20, respectively. The redundant circuits 100 include a plurality of relief memory elements SC. The relief memory elements SC are connected to corresponding pairs of the main I/O lines MIOT/B and the first ports of the corresponding main amplifiers MAMP via switches SW2 (second switch circuit; write port), and to the second ports of the corresponding main amplifiers MAMP via switches SW3 (third switch circuit; read port), respectively. That is, one relief memory element SC is assigned corresponding to one pair of the main I/O lines MIOT/B and one main amplifier MAMP. Even though only a single (one pair) pair of the main I/O lines MIOT/B is shown corresponding to each input and output point, in actuality there is a plurality of pairs of the main I/O lines MIOT/B, and a plurality of the relief memory elements SC, and a plurality of the main amplifiers MAMP corresponding to a plurality of the pairs of the main I/O lines MIOT/B.

As shown in FIG. 2, the relief memory elements SC and the main amplifiers MAMP in an area that is are located along the same side of the memory cell array 20. Furthermore, the relief memory elements SC are located adjacent to the main amplifiers MAMP as well as the address comparison circuit 200 and the control circuit 300 described later.

Figure 5:
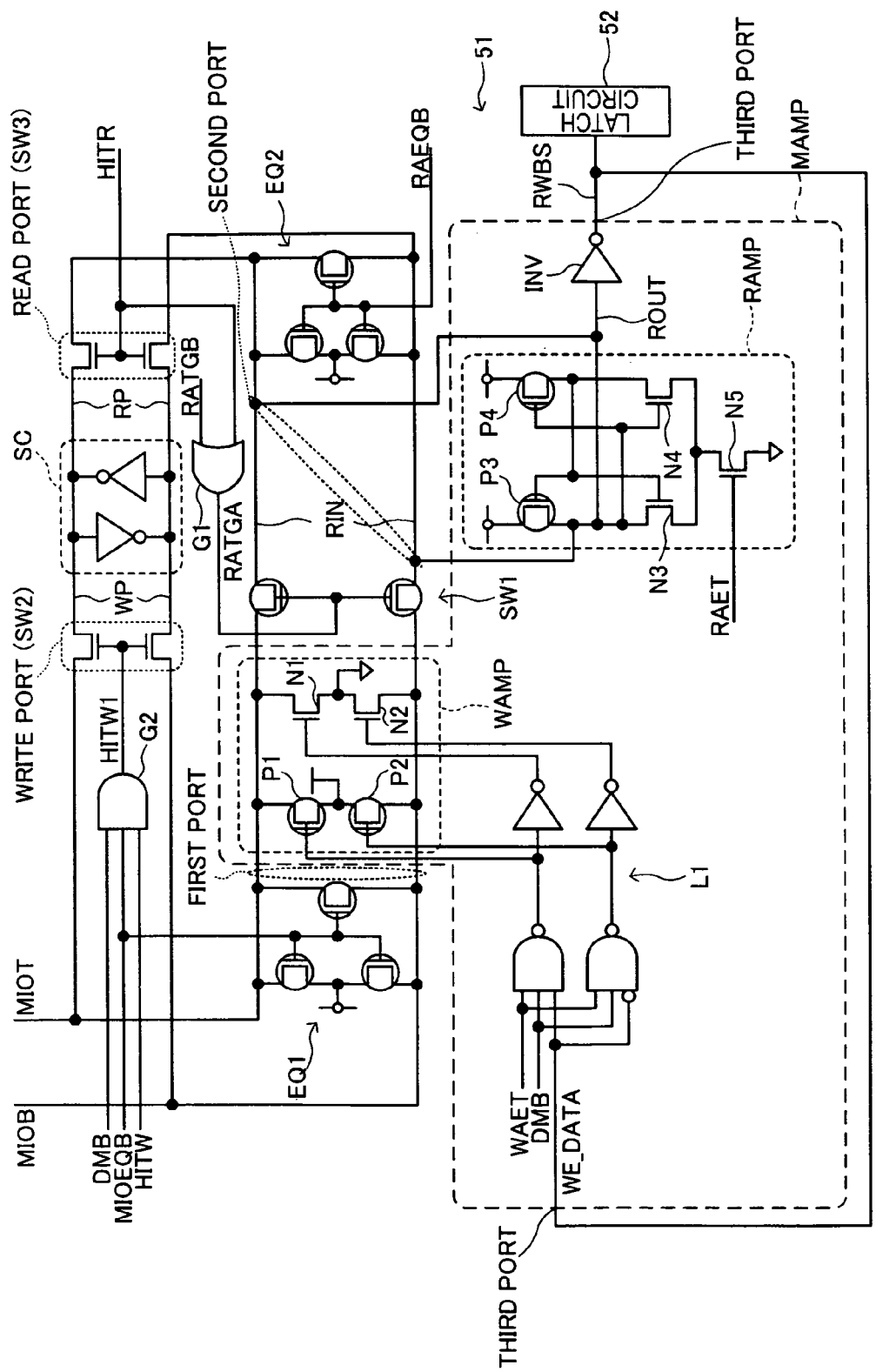
FIG. 5 is a circuit diagram of a main amplifier MAMP and a relief memory element SC.

FIG. 5 is a circuit diagram of the main amplifier MAMP and the relief memory element SC corresponding to a single (one pair) pair of the main I/O lines MIOT/B.

As shown in FIG. 5, the main amplifier MAMP includes a write amplifier WAMP and a read amplifier RAMP. A first port of the write amplifier WAMP is directly connected to the pair of the main I/O lines MIOT/B, while a second port of the read amplifier RAMP is connected to the pair of the main I/O lines MIOT/B via a switch SW1 (first switch circuit). Furthermore, the relief memory element SC includes a write port WP and a read port RP. The write port WP is connected to the pair of the main I/O lines MIOT/B via the switch SW2, while the read port RP is connected to the second port of the read amplifier RAMP via the switch SW3. The relief memory circuit SC is formed, for example, by a flip-flop circuit constituted by two inverters whose input and output are connected to each other. Meanwhile, the switch SW2 can be optionally defined as the write port, and similarly, the switch SW3 can be optionally defined as the read port.

The write amplifier WAMP that is connected to the first port includes P-channel MOS transistors P1 and P2 that are connected, respectively, between a power potential and the pair of the main I/O lines MIOT/B, and N-channel MOS transistors N1 and N2 that are connected, respectively, between ground potential and the pair of the main I/O lines MIOT/B. During a write operation, the transistors P1 and N2 or the transistors P2 and N1 are turned on, based on an output of a logic circuit L1 that receives a write amplifier enable signal WAET, a data mask signal DMB, and write data WR_DATA. The transistors P1 and N2 and the transistors P2 and N1 are respectively connected to the first port.

The write amplifier enable signal WAET is a signal that is activated during a write operation, and is activated to a high level. Thus, when the write amplifier enable signal WAET is deactivated to a low level, the transistors P1, P2, N1, and N2 that form the write amplifier WAMP are all turned off. The data mask signal DMB is a signal that is activated when there is a request for data mask, and is activated to a low level. The term "data mask" indicates that a corresponding write amplifier WAMP is deactivated. The pair of the main I/O lines MIOT/B connected to the first port of the write amplifier WAMP that has been deactivated does not reflect write information (write data) of the corresponding external terminal (DQ terminal). Thus, when the data mask signal DMB is activated to a low level, the transistors P1, P2, N1, and N2 that form the write amplifier WAMP are all turned off. Thus, as long as both of the write amplifier enable signal WAET and the data mask signal DMB have attained a high level, the write amplifier WAMP turns on the transistors P1 and N2 or the transistors P2 and N1 based on a logic level of the write data WR_DATA to supply the write data to the pair of the main I/O lines MIOT/B. The write data WR_DATA is a signal that is supplied from the external terminal (DQ terminal) via the read/write bus RWBS.

The read amplifier RAMP that is connected to the second port includes an inverter constituted by a P-channel MOS transistor P3 and an N-channel MOS transistor N3, a flip-flop circuit formed by a cross-coupled inverter constituted by a P-channel MOS transistor P4 and an N-channel MOS transistor N4, and an N-channel MOS transistor N5 that activates the flip-flop circuit. The read amplifier enable signal RAET is supplied to a gate electrode of the transistor N5. Input terminals RIN of the read amplifier RAMP are connected to the pair of the main I/O lines MIOT/B via the switch SW1, while an output terminal ROUT is connected to the read/write bus RWBS via an inverter INV.

The switch SW1 that is connected between the first port and the second port is constituted by P-channel MOS transistors. A control signal RATGA is supplied to a gate electrode of the switch SW1. The control signal RATGA is a signal output from an OR gate circuit G1 that receives a read signal RATGB and a hit signal HITR. The read signal RATGB is a signal that is activated to a low level during a read operation, and the hit signal HITR is a signal that is activated to a high level when the hit signal HIT is activated during a read operation. Thus, the switch SW1 is turned on only when the hit signal HITR is not activated during a read operation. That is, the switch SW1 is turned off when the hit signal HITR is activated, even during a read operation. It can be also said that the switch SW1 is connected between the write port and the read port of the relief memory element SC. It can be also said that the switch SW1 is connected between the pair of the main I/O lines MIOT/B and the second port.

The switch SW2, which is a write port, is constituted by N-channel MOS transistors. A control signal HITW1 is supplied to a gate electrode of the switch SW2. The control signal HITW1 is a signal output from an AND gate circuit G2 that receives a data mask signal DMB, an equalization signal MIOEQB, and a hit signal HITW. The equalization signal MIOEQB is a signal that is activated to a low level during a precharge operation. The hit signal HITW is a signal that is activated to a high level when the hit signal HIT is activated during a write operation. Thus, the switch SW2 is turned on only when the hit signal HITW is activated to a high level and data mask signal DMB is not activated to a low level during a write operation. That is, the switch SW2 is turned off when the data mask signal DMB is activated, even if the hit signal HITW is activated during a write operation.

The switch SW3, which is a read port, is constituted by N-channel MOS transistors. The hit signal HITRA is supplied to a gate electrode of the switch SW3.

An equalizing circuit EQ1 is connected to the pair of the main I/O lines MIOT/B. When the equalization signal MIOEQB is activated to a low level, the pair of the main I/O lines MIOT/B is equalized to a precharge potential. Similarly, an equalizing circuit EQ2 is connected to the input terminals RIN of the read amplifier RAMP. When an equalization signal RAEQB is activated to a low level, the input terminals RIN of the read amplifier RAMP are equalized to the precharge potential. An equalized potential is of the same potential level as the power potential that is supplied by the write amplifier WAMP to one of the pair of the main I/O lines MIOT/B.

Figure 6:
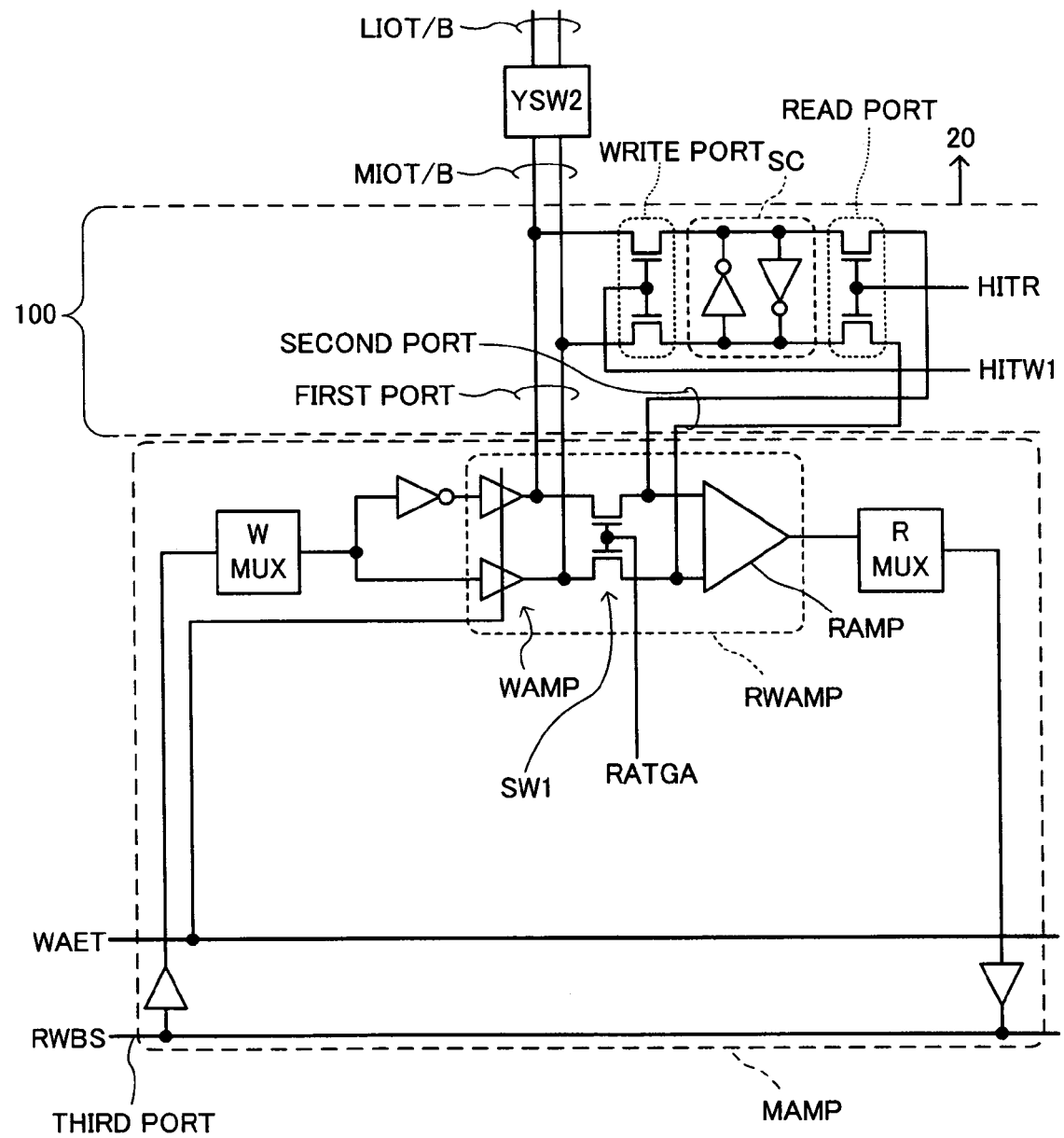
FIG. 6 is a diagram for explaining a layout of the main amplifier MAMP and the relief memory element SC.

FIG. 6 is an explanatory diagram of a layout of the main amplifier MAMP and the relief memory element SC corresponding to a single pair (one pair) of the main I/O lines MIOT/B.

As shown in FIG. 6, the pair of the main I/O lines MIOT/B connects the second column switch YSW2 located inside the memory cell array 20 and the main amplifier MAMP located outside of the memory cell array 20. Due to one of the second column switches YSW2 provided corresponding to the pairs of the local I/O lines LIOT/B being selectively turned on, the corresponding pair of the local I/O lines LIOT/B is electrically connected to one pair of the main I/O lines MIOT/B. To increase an integration degree, a relatively small line and space value (L/S) (=LS1) of the wirings (for example, main I/O lines MIOT/B) is set inside (sub-word drivers, sense amplifiers, column switches, and intersection areas XA) the memory cell array 20. In contrast, a larger line and space value (L/S) (=LS2) of the wirings (for example, the read/write bus RWBS) relative to the line and space value LS1 is set in the area outside of the memory cell array 20 to prevent a defect from occurring. This is because no relief by the redundant circuit and the like is possible when a defect occur. That is, LS1<LS2. Furthermore, the write amplifier WAMP, the read amplifier RAMP, and the first switch circuit (SW1) are defined as a read/write amplifier RWAMP. In this case, the line and space value (L/S) indicates, for example, a line and space value of transistors, wirings, and contacts of the read/write amplifier RWAMP.

In the present embodiment, the relief memory elements SC are located in the area outside of the memory cell array 20, and thus a relatively large line and space value (LS2) is set. Therefore, the possibility of the relief memory elements SC themselves becoming defective is almost none, as compared to the case where the relief memory elements SC are located inside the memory cell array 20. Accordingly, there is no need to provide a circuit (I/O redundant circuit or the like) in anticipation of a defect occurring in the relief memory elements SC.

As shown in FIG. 6, the pair of the main I/O lines MIOT/B is connected to the input terminal (second port) of the read amplifier RAMP of the read/write amplifier RWAMP via the switch SW1 and to the output terminal (first port) of the write amplifier WAMP of the read/write amplifier RWAMP. As described above, the write amplifier WAMP is a circuit that supplies the write data on the read/write bus RWBS to the pair of the main I/O lines MIOT/B when the write amplifier enable signal WAET is activated, and like the read amplifier RAMP, is located in the area outside of the memory cell array 20. A write multiplexer WMUX is interposed between the read/write bus RWBS and the read amplifier RAMP, and selection is performed according to the column address CA (not shown) or the like. That is, the write data on a single read/write bus RWBS is supplied to one of the write amplifiers WAMP. The write multiplexer WMUX has a well-known serial-to-parallel conversion function. A read multiplexer RMUX is similarly interposed between the read amplifier RAMP and the read/write bus RWBS, and selection is performed according to the column address CA or the like. That is, a piece of read data among a plurality of pieces of read data on the corresponding plurality of the read/write buses RWBS is selectively supplied to the read/write bus RWBS. The read multiplexer RMUX has a well-known parallel-to-serial conversion function. The relief memory elements SC provided in the proximity of or adjacent to one side of the memory cell array 20 are located such that their electrical properties with the read amplifier RAMP and the write amplifier WAMP are the best. Problems on electrical characteristics of timing margin and the like by well-known delay in the operation of the redundant circuits and delay in the activation of the redundant circuits, do not arise at all.

Figures 7A, 7B:
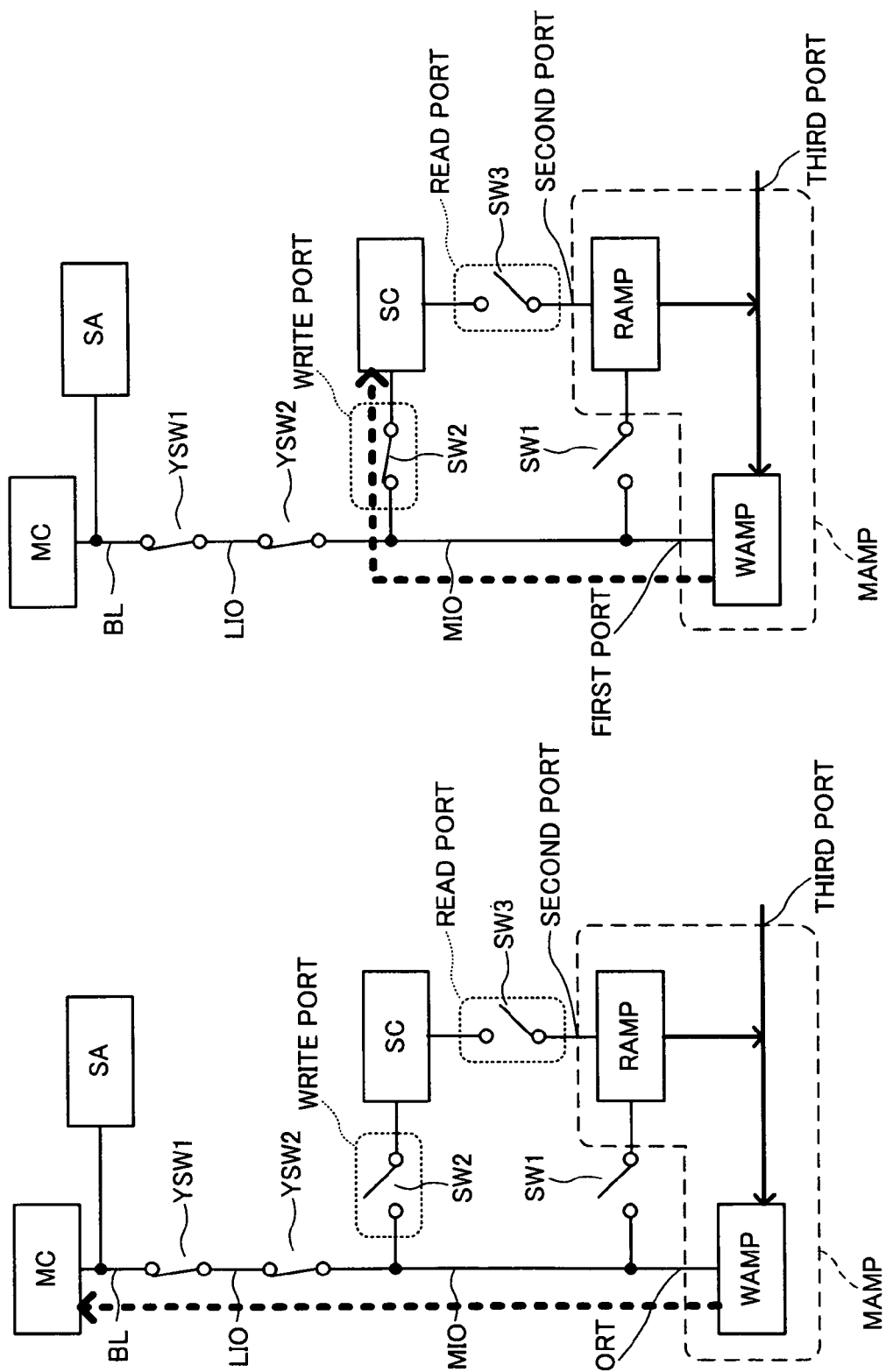
FIGS. 7A and 7B are schematic diagrams for explaining an operation of switches SW1 to SW3 during a write operation, where

FIGS. 7A and 7B are schematic diagrams for explaining an operation of the switches SW1 to SW3 during a write operation, where FIG. 7A shows a case when the hit signal HIT is not activated, and FIG. 7B shows a case when the hit signal HIT is activated (and the data mask signal DMB is deactivated).

As shown in FIG. 7A, during a write operation, when the hit signal HIT is not activated (and the regular memory cell MC is functioning normally), all the switches SW1 to SW3 (the first switch circuit, the write port, and the read port) remain turned off. Due to this, the write data output from the first port of the write amplifier WAMP is supplied to the regular memory cell MC via the main I/O line MIO, the local I/O line LIO, and the bit line BL. In this case, the write data output from the write amplifier WAMP is not supplied to the relief memory element SC.

As shown in FIG. 7B, during a write operation, when the hit signal HIT is activated (and the regular memory cell MC is defective), and additionally the data mask signal DMB is not activated, the switch SW2 (write port) is turned on, but the switch SW1 (first switch circuit) and the switch SW3 (read port) remain turned off. Due to this, the write data output from the first port of the write amplifier WAMP is supplied to the relief memory element SC via the main I/O line MIO and the write port. At the same time, the write data is also supplied to the defective memory cell MC via the local I/O line LIO and the bit line BL, but this write data is regarded as invalid. By not controlling either of or both of the first column switch YSW1 and the second column switch YSW2 with the hit signal HIT, access delay due to redundancy can be reduced. Furthermore, by not placing the relief memory element SC within the memory cell array 20, an area of the memory cell array 20 and power consumption is prevented from increasing.

On the other hand, during a write operation, when the hit signal HIT is activated (and the regular memory cell MC is defective), and additionally the data mask signal DMB is activated, the operation shown in FIG. 7A is performed. That is, all the switches SW1 to SW3 (the first switch circuit, the write port, and the read port) remain turned off. Due to this, the relief memory element SC remains unconnected to the main I/O line MIO. Therefore, data stored in the relief memory element SC is not destroyed because of disturbance due to uncertain potential from the main I/O line MIO due to the switch SW2 (write port) being on, as shown in FIG. 7B. That is, if the switch SW2 is turned on as shown in FIG. 7B, when the data mask signal DMB is activated, the invalid data read from the defective memory cell MC is amplified by the sense amplifier SA, resulting in a threat to the data stored in the relief memory element SC. The reason for this is that because the column switch YSW2 is a path gate circuit, the sense amplifier SA drives the main I/O line MIO.

In contrast, in the present embodiment, the switches SW1 to SW3 remain turned off when the data mask signal DMB is activated. Consequently, the data stored in the relief memory element SC remains unharmed.

Figure 8A:
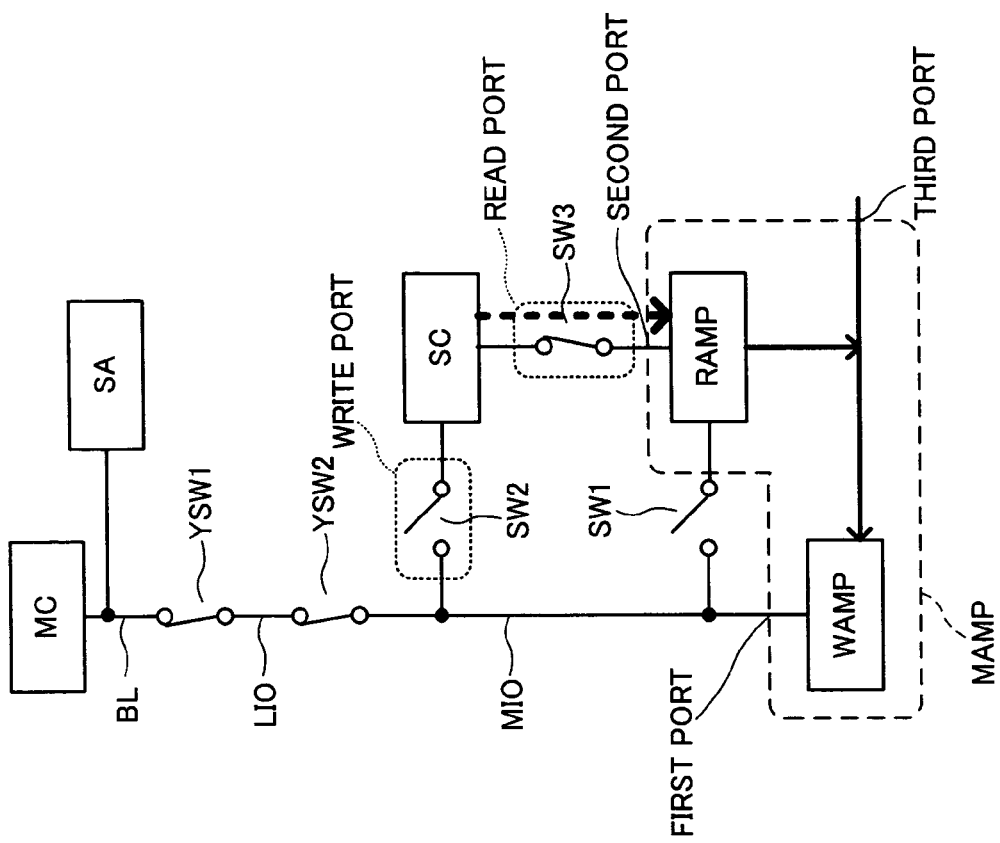
FIGS. 8A and 8B are schematic diagrams for explaining an operation of the switches SW1 to SW3 during a read operation, where
Figure 8B:
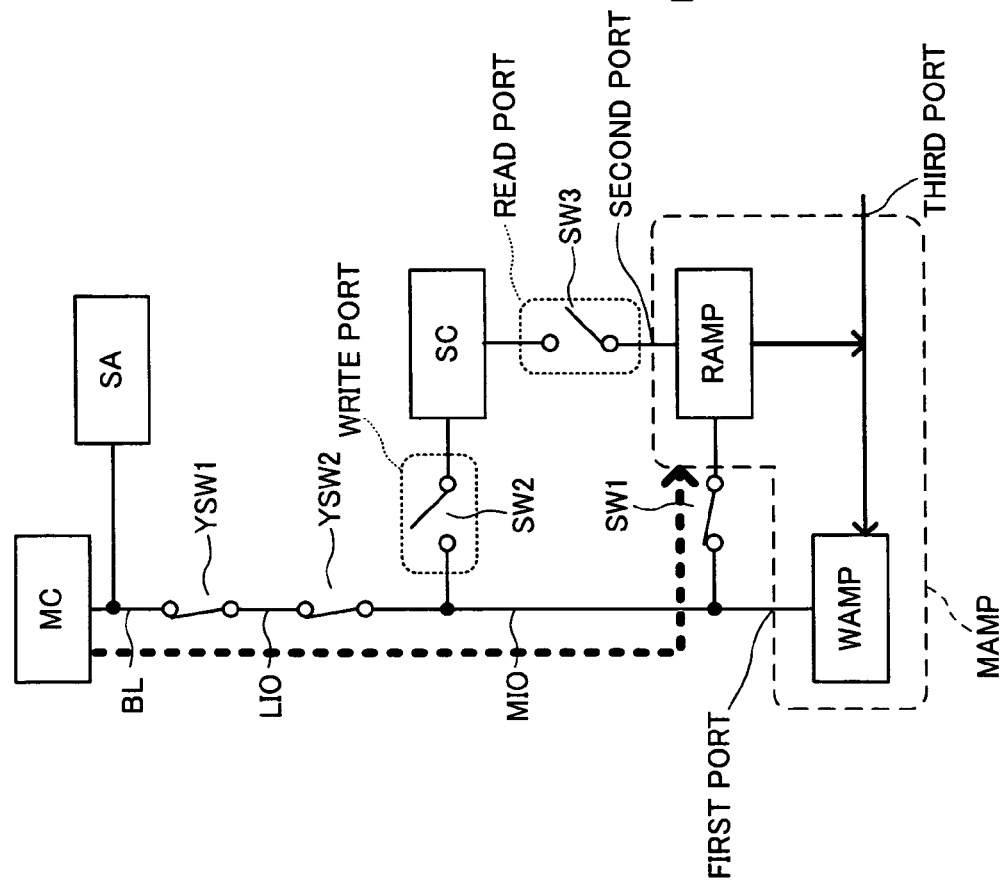

FIGS. 8A and 8B are schematic diagrams for explaining an operation of the switches SW1 to SW3 during a read operation, where FIG. 8A shows a case when the hit signal HIT is not activated (and the regular memory cell MC is functioning normally), and FIG. 8B shows a case when the hit signal HIT is activated (and the regular memory cell is defective).

As shown in FIG. 8A, during a read operation, when the hit signal HIT is not activated (and the regular memory cell SC is functioning normally), the switch SW1 (first switch circuit) is turned on, and the switch SW2 (write port) as well as the switch SW3 (read port) remain turned off. Due to this, the read data in the regular memory cell MC that is amplified by the sense amplifier SA is supplied to the second port of the read amplifier RAMP via the bit line BL, the local I/O line LIO, the main I/O line MIO, and the switch SW1 (first switch circuit). In this case, the output of the relief memory element SC is not supplied to the second port of the read amplifier RAMP because of the switch SW3 (read port) being turned off.

On the other hand, as shown in FIG. 8B, during a read operation, when the hit signal HIT is activated (and the regular memory cell MC is defective), the switch SW3 (read port) is turned on, and the switch SW1 (first switch circuit) as well as the switch SW2 (write port) remain turned off. Due to this, the read data read by the read port of the relief memory element SC is supplied to the second port of the read amplifier RAMP. At the same time, the invalid read data from the defective memory cell MC is amplified by the sense amplifier SA and supplied to the bit line BL, the local I/O line LIO, and the main I/O line MIO. However, the invalid read data is not supplied to the second port of the read amplifier RAMP due to the switch SW1 being turned off.

Figure 9:
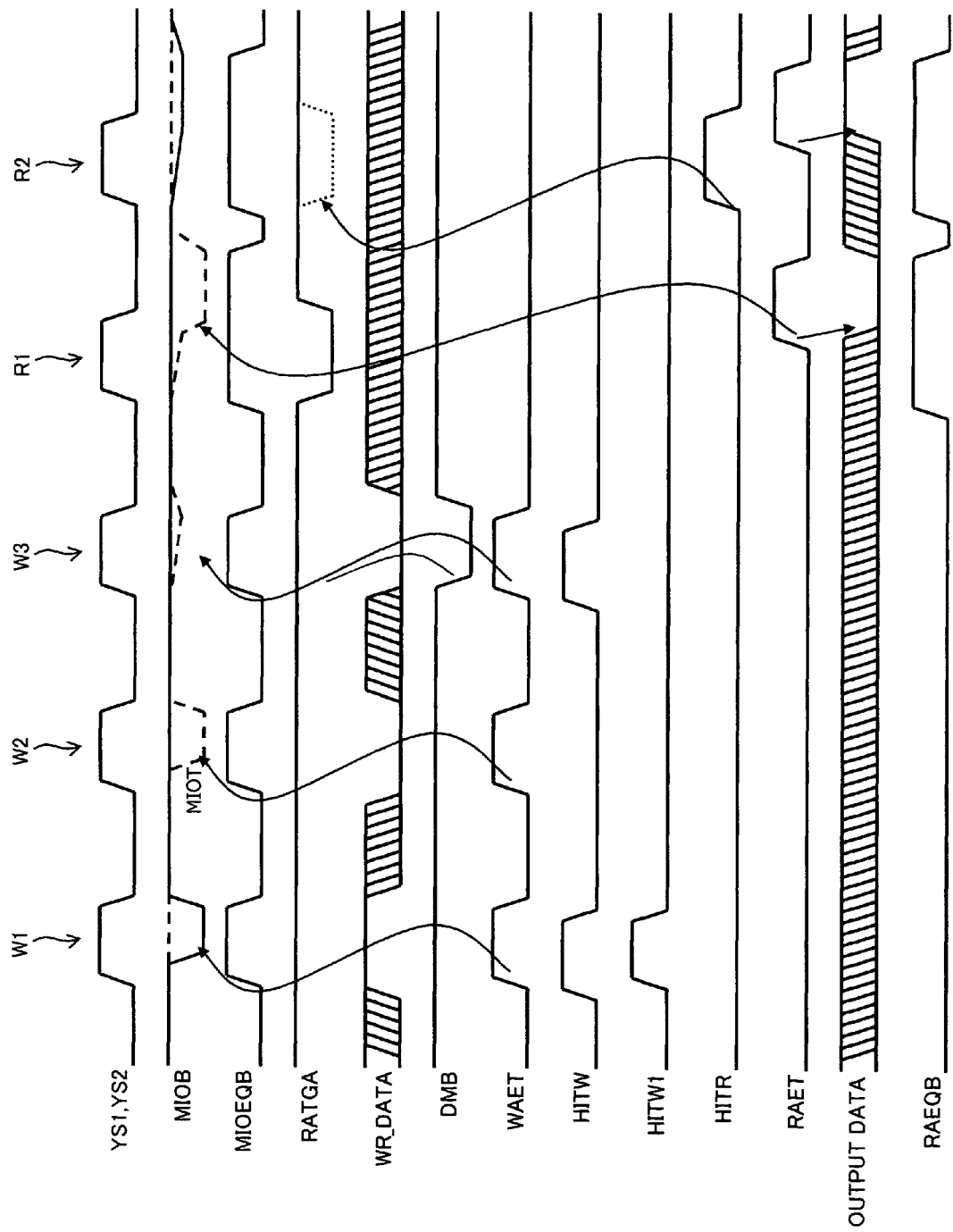
FIG. 9 is a timing chart for explaining an operation of the semiconductor device 10.

FIG. 9 is a timing chart for explaining an operation of the semiconductor device 10 according to the present embodiment.

FIG. 9 shows five patterns of accesses that differ from each other. Specifically, an access W1 indicates an operation when the hit signal HIT is activated (and the data mask signal DMB is deactivated) during a write operation. An access W2 indicates an operation when the hit signal HIT is not activated during a write operation. An access W3 indicates an operation when the hit signal HIT is activated (and the data mask signal DMB is also activated) during a write operation. An access R1 indicates an operation when the hit signal HIT is not activated during a read operation. An access R2 indicates an operation when the hit signal HIT is activated during a read operation. More specifically, assuming that a predetermined address at which the hit signal HIT is activated is ADD1, and a predetermined address at which it is not activated is ADD2, a high level data is written to the address ADD1 during the access W1, a low level data is written to the address ADD2 during the access W2, a low level data is written (data mask enabled) to the address ADD1 during the access W3, data is read from the address ADD2 during the access R1, and data is read from the address ADD1 during the access R2. Accordingly, the data read during the access R2 is read from the relief memory element SC.

Figure 10:
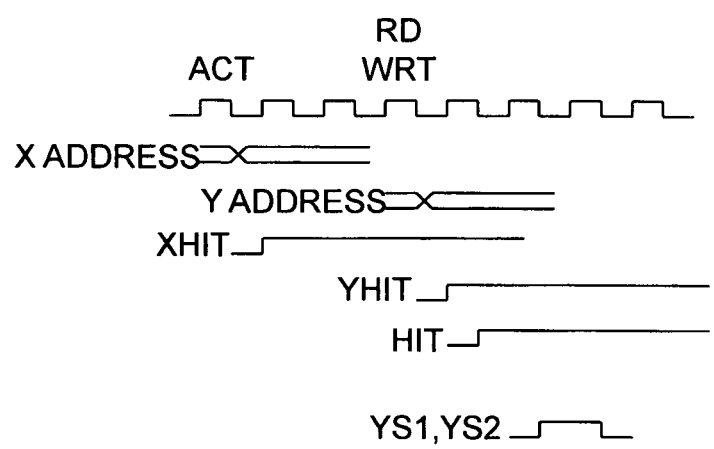
FIG. 10 is timing chart showing an operation when a request to access a relief target address is detected by an address comparison circuit 200.

As shown in FIG. 10, the five accesses described above are performed by inputting an X address (a row address) in synchronization with an activate command (ACT), and a Y address (a column address) in synchronization with a write command (WRT) or a read command (RD). If the X address is a relief target address, it is detected by the address comparison circuit 200, and a hit signal XHIT, which is an internal signal, is activated. Furthermore, if the Y address is a relief target address, it is detected by the address comparison circuit 200, and a hit signal YHIT, which is an internal signal, is activated. When both of the hit signals XHIT and YHIT are activated, the address comparison circuit 200 activates the hit signal HIT. Thereafter, the column selection signals YS1 and YS2 are activated.

In the example shown in FIG. 9, during the access W1, a high level write data WR_DATA is supplied, and due to this, the main I/O line MIOT is driven to a high level, and the main I/O line MIOB is driven to a low level by the write amplifier WAMP. Because the switch SW2 is turned on as shown in FIG. 7B during the access W1, the write data WR_DATA is written to the relief memory element SC.

During the access W2, a low level write data WR_DATA is supplied, and due to this, the main I/O line MIOT is driven to a low level, and the main I/O line MIOB is driven to a high level by the write amplifier WAMP. Because all the switches SW1 to SW3 are turned off as shown in FIG. 7A during the access W2, the write data WE_DATA is written to the selected memory cell MC.

Further, during the access W3, a high level write data WR_DATA is supplied. However, in the example, because the data mask signal DMB is activated, the write amplifier WAMP remains deactivated, and therefore the pair of the main I/O lines MIOT/B is not driven by the write amplifier WAMP. However, because one of the column switches YSW1 and YSW2 is turned on according to the column address, the invalid data read from the defective memory cell MC is amplified by the sense amplifier SA, leading to a slight change in the potential of the pair of the main I/O lines MIOT/B. However, in the present embodiment, as shown in FIG. 7A, the switch SW2 is turned off when the data mask signal DMB is activated. Therefore, the data stored in the relief memory element SC is not destroyed by the change in the potential of the pair of the main I/O lines MIOT/B.

Further, in the example shown in FIG. 9, during the access R1, a low level read data is read from the memory cell MC. Due to this, the main I/O line MIOT is driven to a low level, and the main I/O line MIOB is driven to a high level by the sense amplifier SA. Because the switch SW1 is turned on as shown in FIG. 8A during the access R1, the read data read into the pair of the main I/O lines MIOT/B is further amplified by the read amplifier RAMP.

Further, during the access R2, the invalid read data is read from the defective memory cell MC. Due to this, the potential of the pair of the main I/O lines MIOT/B is changed by the sense amplifier SA. However, during the access R2, because the switch SW1 is turned off when the hit signal HIT is activated, as shown in FIG. 8B, the invalid read data read into the pair of the main I/O lines MIOT/B is not supplied to the read amplifier RAMP. Instead, because the switch SW3 is turned on, the data stored in the relief memory element SC is supplied to the read amplifier RAMP, and this data is output as the read data. Because the switch SW2 remains turned off during this time, the data stored in the relief memory element SC remains unharmed by the invalid read data read into the pair of the main I/O lines MIOT/B.

As described above, according to the present embodiment, because the relief memory elements SC are arranged outside of the memory cell array 20, the line and space value (LS2) of the transistors, wirings, and contacts that constitute the relief memory element SC can be designed so as to be larger than the line and space value (LS1) of the transistors, wirings, and contacts that constitute the sense amplifiers SA arranged within the memory cell array 20. Due to this, the possibility of the relief memory elements SC themselves becoming defective is almost none.

Moreover, even if the hit signal HIT is activated during a write operation, the relief memory element SC and the pair of the main I/O lines MIOT/B are not connected when the data mask signal DMB is activated. Thus, even if the pair of the main I/O lines MIOT/B is driven by the sense amplifier SA, the data in the relief memory element SC remains unharmed.

Furthermore, when the hit signal HIT is activated during a read operation, even if the pair of the main I/O lines MIOT/B is driven by the sense amplifier SA, the data in the relief memory element SC remains unharmed because the relief memory element SC is directly connected to the main amplifier MAMP and not via the pair of the main I/O lines MIOT/B.

Furthermore, the write amplifier WAMP is activated during a write operation and the read amplifier RAMP is activated during a read operation, regardless of whether the hit signal HIT is activated. Consequently, a simpler circuit configuration can be realized as compared to a system that requires that the write amplifier WAMP or the read amplifier RAMP be bypassed when the hit signal HIT is activated.

In the present embodiment, the data buses that connect the memory cells in the memory cell array 20 and the main amplifier MAMP located outside of the memory cell array 20 are hierarchized. The relief memory elements SC are directly connected to the data buses (for example, the pairs of the main I/O lines, which form the uppermost data buses) through which input and output of data are conducted between the memory cell array 20 and the outside. Therefore, there is no need to change the timing at which the switch SW2 is turned on according to the position of the replacement target memory cell MC within the memory cell array 20. Thus, the redundant circuits 100 can be easily controlled.

Figure 11:
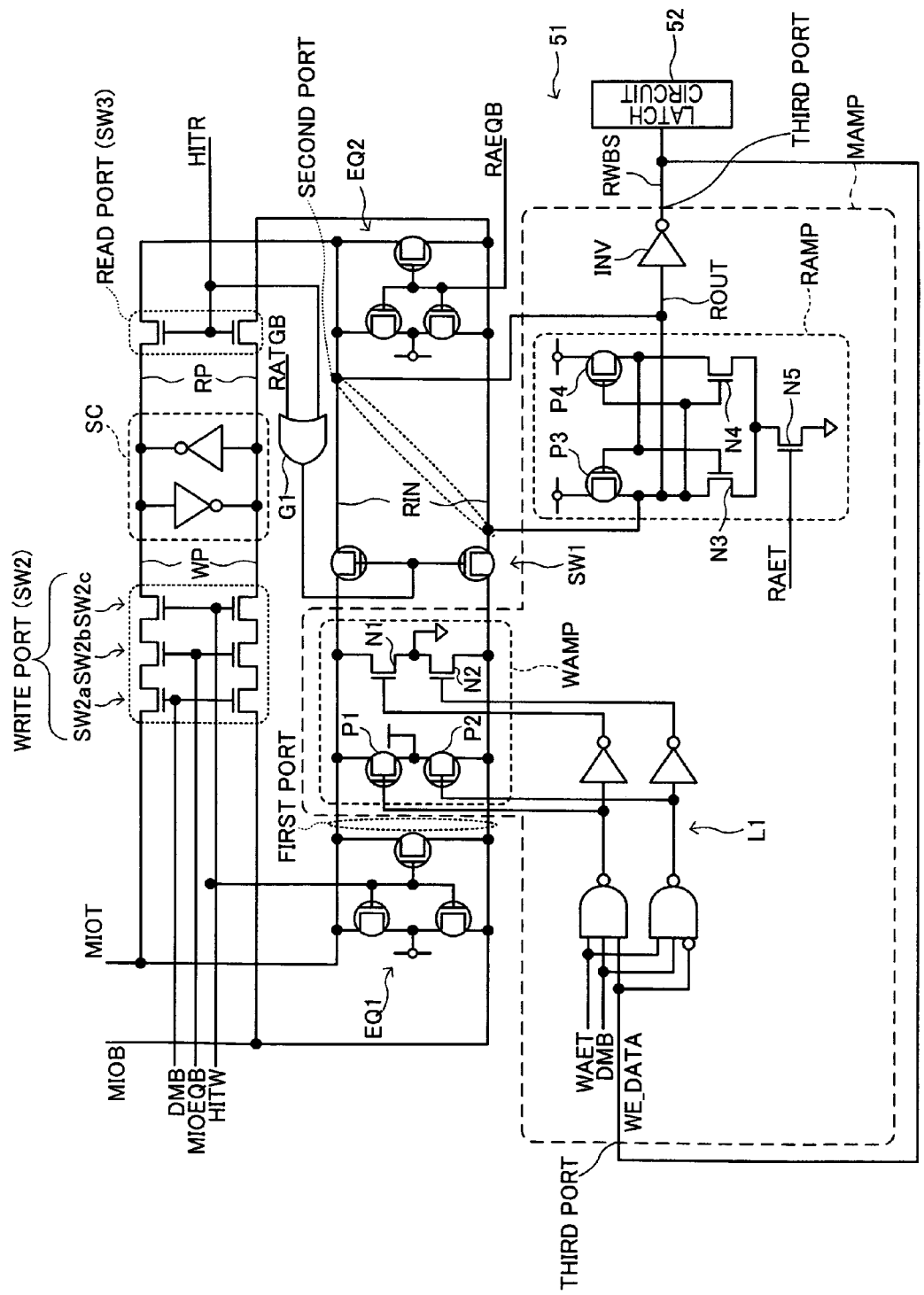
FIG. 11 is a circuit diagram of the main amplifier MAMP and the relief memory element SC according to a modification.

FIG. 11 is a circuit diagram of the main amplifier MAMP and the relief memory element SC according to a modification of the write port shown in FIG. 5.

In the example shown in FIG. 11, a circuit configuration of the switch SW2 (write port) differs from that shown in FIG. 5. Other features of the circuit shown in FIG. 11 are identical to those of the circuit shown in FIG. 5, and thus like elements are denoted by like reference numerals and redundant explanations thereof will be omitted.

The switch SW2 (write port) shown in FIG. 11 is constituted by unit switches SW2a, SW2b, and SW2c connected in series. A gate electrode of the unit switch SW2a receives the data mask signal DMB, a gate electrode of the unit switch SW2b receives the equalization signal MIOEQB, and a gate electrode of the unit switch SW2c receives the hit signal HITW. Thus, when the data mask signal DMB, the equalization signal MIOEQB, and the hit signal HITW are all at a high level, the switch SW2 performs exactly the same operation as the switch SW2 shown in FIG. 5 by connecting the relief memory element SC to the pair of the main I/O lines MIOT/B. Furthermore, in the example shown in FIG. 11, a relatively less number of transistors are used as compared to the example shown in FIG. 5. In addition, because the transistors are all solely N-channel MOS transistors, no well separation is required. Consequently, a layout area can be reduced. Further, greater second power potential than a first power potential, which drives the main amplifier MAMP, is applied to at least one gate electrode of the plurality of the gate electrodes of the unit switches SW2a, SW2b, and SW2c. For example, a higher potential than the power potential connected to a source terminal of each of the P-channel MOS transistors P1 and P2 that constitute the write amplifier WAMP connected to the first port is supplied to at least one among the data mask signal DMB, the equalization signal MIOEQB, and the hit signal HITW. Among the data mask signal DMB, the equalization signal MIOEQB, and the hit signal HITW, preferably, the higher potential is supplied to a signal that transitions or settles last. Due to this, it is possible to suppress an increase in an impedance at the time of electrical conduction due to threshold values of the transistors forming the unit switches SW2a, SW2b, and SW2c even when the transistors are all N-channel MOS transistors. As a result, a write time required for writing to the relief memory element SC can be reduced.

Figure 12:
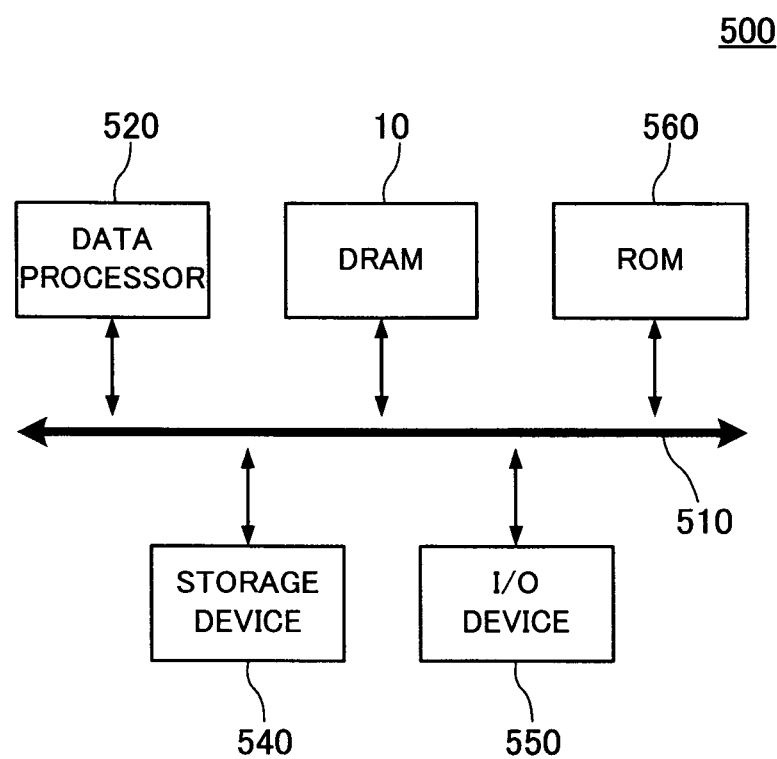
FIG. 12 is a block diagram showing a configuration of a data processing system 500 using the semiconductor device 10 according to the embodiment of the present invention.

FIG. 12 is a block diagram showing the configuration of a data processing system 500 using the semiconductor device 10 according to this embodiment.

The data processing system 500 shown in FIG. 12 has a configuration in which a data processor 520 and the semiconductor device (DRAM) 10 according to this embodiment are mutually connected via a system bus 510. The data processor 520, for example, includes micro-processor (MPU) or digital signal processor (DSP). But it is not limited to them. In FIG. 12, for the sake of shorthand, the data processor 520 and the DRAM 10 are connected via the system bus 510. But they may be connected using a local bus not via the system bus 510.

In FIG. 12, for the sake of shorthand, only one set of the system bus 510 is drawn. But a plurality of system buses 510 may be provided in serial or parallel manner via some connectors etc., if needed. In the data processing system 500 shown in FIG. 12, a storage device 540, I/O device 550, and ROM 560 are also connected to the system bus 510. But these components are not indispensable.

The storage device 540 may be a hard disk drive, an optical disk drive, or a flash memory. The I/O device 550 may be one or more display devices such as a liquid display, but not limited to, or one or more input devices such as a keyboard, a mouse, but not limited to. I/O device 550 can be only one of the input device and the output device.

Though only one component is drawn for each of the components shown in FIG. 12, the number of each of the components is not limited to one. The data processing system 500 can include a plurality of each of the components.

In the above embodiment of the present invention, a controller (for example, the data processor 520) that controls the DRAM 10 issues a write command to the DRAM 10 and sends an address to be written and a write data to the DRAM 10. The controller also issues an address to be read and a read command to the DRAM 10 and receives corresponding data from the DRAM 10. The DRAM 10 compares information pertaining to faulty memory cells within itself with the address to be written and the address to be read, if a match is found, relief memory elements within the DRAM 10 communicate with the system bus 510. Note that the plurality of commands issued by the controller are commands (system commands) defined by a trade organization (JEDEC (Joint Electron Device Engineering Council) Solid State Technology Association) that controls known semiconductor devices.

It is apparent that the present invention is not limited to the above embodiments, but may be modified and changed without departing from the scope and spirit of the invention.

For example, in the above embodiment, while a flip-flop circuit is used as the relief memory element SC, any memory element that can hold data in a static manner, such as a register, can be used.

The basic technical concept of the present application is not limited to that described above. For example, while a DRAM has been disclosed in the above embodiment, the basic technical concept of the present application is not limited thereto, and an SRAM, a synchronous memory, a non-volatile memory or the like can be also used. Furthermore, types of circuits other than that disclosed in the above embodiment can be used for the write amplifier WAMP, the read amplifier RAMP, the equalizing circuits EQ1 and EQ2, the write port, the read port, the first switch circuit, and the circuits that generate the control signals. Moreover, the relief memory elements SC can be placed in a location other than that disclosed in the above embodiment. Furthermore, the pair of the local I/O lines LIOT/B and the pair of the main I/O lines MIOT/B can be single phase signals, instead of complementary signals. In addition, a sub-amplifier can be provided at the intersection area XA to further amplify the read data sensed in the pair of the local I/O lines LIOT/B by the sense amplifier SA.

The technical concept of the present invention can be applied to not only a dedicated memory device but also various types of semiconductor devices. For example, the present invention can be applied to a general semiconductor device such as a CPU (Central Processing Unit), an MCU (Micro Control Unit), a DSP (Digital Signal Processor), an ASIC (Application Specific Integrated Circuit), and an ASSP (Application Specific Standard Circuit), each of which includes a memory function. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When an FET (Field Effect Transistor) is used as the transistor in the present invention, various types of FETs such as MIS (Metal-Insulator Semiconductor) and TFT (Thin Film Transistor) can be used as well as MOS (Metal Oxide Semiconductor). Further, transistors other than FETs such as bipolar transistors can be used as some of transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
    a bit line that transmits write data to be written to a memory cell and read data read from the memory cell;
    a write amplifier that is connected to the bit line;
    a read amplifier that is connected to the bit line via a first switch circuit;
    a relief memory element that includes a write port and a read port, the write port being connected to the bit line via a second switch circuit, and the read port being connected to the read amplifier via a third switch circuit; and
    a control circuit that controls an operation of each of the first, second and third switch circuits, wherein
    the control circuit controls the second switch circuit into an electrically on state so as to supply the write data from the write amplifier to the relief memory element via the bit line in response to the memory cell being defective during a write operation, and
    the control circuit controls the first switch circuit into an electrically off state and controls the third switch circuit into an electrically on state so as to supply relief data from the relief memory element to the read amplifier in response to the memory cell being defective during a read operation.

2. The semiconductor device as claimed in claim 1, wherein
    the control circuit controls the second switch circuit into an electrically off state in response to the memory cell being not defective during the write operation, and
    the control circuit controls the first switch circuit into an electrically on state and the third switch circuit into an electrically off state in response to the memory cell being not defective during the read operation.

3. The semiconductor device as claimed in claim 1, wherein
    the control circuit controls the first and third switch circuits into an electrically off state regardless of whether the memory cell is defective or not during the write operation, and
    the control circuit controls the second switch circuit into an electrically off state regardless of whether the memory cell is defective or not during the read operation.

4. The semiconductor device as claimed in claim 1, wherein the write amplifier and the read amplifier are activated in response to a request to access the memory cell, regardless of whether the memory cell is defective or not.

5. The semiconductor device as claimed in claim 1, wherein the control circuit controls the second switch circuit into an electrically off state and deactivates the write amplifier regardless of the write data that is supplied from outside of the semiconductor device when a data mask signal is activated.

6. The semiconductor device as claimed in claim 5, wherein the control circuit includes a logic gate circuit that receives a plurality of control signals including , a hit signal and the data mask signal, the hit signal being activated in response to the memory cell being defective during the write operation,
    wherein the second switch circuit is controlled by an output signal of the logic gate circuit.

7. The semiconductor device as claimed in claim 5, wherein
    the second switch circuit comprises a configuration constituted by a plurality of unit switches, which include a first unit switch and a second unit switch, that are connected in series,
    the first unit switch is controlled by a hit signal that is activated in response to the memory cell being defective during the write operation, and
    the second unit switch is controlled by the data mask signal.

8. The semiconductor device as claimed in claim 1, wherein
    the device further comprises a plurality of memory cells including the memory cell, the memory cells being arranged in a memory cell array area,
    the bit line comprises a hierarchical structure that includes a plurality of local bit lines and a global bit line that is electrically connected to one of the local bit lines selected according to an address signal,
    each of the local bit lines is connected to an associated one of the memory cells, and the global bit line is connected to the write amplifier, to the read amplifier via the first switch circuit, and to the relief memory element via the second switch circuit.

9. The semiconductor device as claimed in claim 8, wherein the write amplifier, the read amplifier, and the relief memory element are arranged outside of the memory cell array area.

10. The semiconductor device as claimed in claim 9, wherein the relief memory element is arranged along one side of the memory cell array area.

11. The semiconductor device as claimed in claim 9, wherein
    the memory cell array area includes a plurality of sense amplifiers that are connected to the local bit lines, respectively, and
    a line and space value (L/S) of each of transistors, wirings, and contact electrodes that constitute the relief memory element is larger than a line and space value (L/S) of each of transistors, wirings, and contact electrodes that constitute the sense amplifiers.

12. The semiconductor device as claimed in claim 8, wherein one of the local bit lines is electrically connected to the global bit line in response to the address signal, regardless of whether the one of the memory cells is defective or not.

13. A semiconductor device comprising:
    a plurality of memory cells;
    a plurality of first bit lines, a first selected one of the first bit lines is electrically connected to a selected one of the memory cells according to a first address signal;
    a second bit line to which a second selected one of the first bit lines is electrically connected according to a second address signal;
    a first switch circuit that is connected to the second bit line;
    a main amplifier that includes a first port that is connected to the second bit line, a second port that is connected to the second bit line via the first switch circuit, and a third port;
    a relief memory element that includes a first relief route and a second relief route, the first relief route being connected to the second bit line when the first relief route is activated, and the second relief route being connected to the second port of the main amplifier when the second relief route is activated; and a control circuit that is configured to access the relief memory element in response to both of the first and second address signals indicating defective addresses with the control circuit activating the first relief route of the relief memory element during a write operation and with the control circuit activating the second relief route of the relief memory element and controlling the first switch circuit into an electrically off state during a read operation so that a write data is written into the relief memory element from the third port of the main amplifier via the first port of the main amplifier, the second bit line and the first relief route of the relief memory element during the write operation and that a read data is read out from the relief memory element and supplied to the third port of the main amplifier via the second port of the main amplifier and the second relief route of the relief memory element during the read operation.

14. The semiconductor device as claimed in claim 13, wherein the control circuit deactivates both of the first and second relief routes of the relief memory element when at least one of the first and second address signals does not indicate a corresponding one of the defective addresses.

15. The semiconductor device as claimed in claim 13, further comprising a sense amplifier that is connected to the first selected one of the first bit lines,
wherein the control circuit deactivates the first relief route of the relief memory element when both of the first and second address signals indicate the defective addresses and when a data mask signal is activated to mask the write data during the write operation.

16. The semiconductor device as claimed in claim 13, wherein the relief memory element comprises a flip-flop circuit.

17. The semiconductor device as claimed in claim 13, wherein the main amplifier includes:
a write amplifier that receives the write data via the third port and outputs the write data to the first port; and
a read amplifier that receives the read data from the relief memory element via the second port and outputs the read data to the third port.

18. The semiconductor device as claimed in claim 17, further comprising an address comparison circuit that activates a hit signal in response to both of the first and second address indicating the defective addresses, wherein:
the control circuit controls the first and second relief ports of the relief memory element, and the first switch circuit in response to activation of the hit signal, and
the write amplifier and the read amplifier are activated, regardless of activation of the hit signal.

19. The semiconductor device as claimed in claim 13, wherein:
the write port includes a plurality of transistors that are connected in series between the second bit line and the first relief port of the relief memory element, and
a second power potential that is greater than a first power potential that drives the main amplifier is applied to a gate electrode of at least one of the transistors.

20. A semiconductor device comprising:
a plurality of memory cells;
an input/output line coupled to a selected one of the memory cells via a column switch circuit;
a bus line;
a write amplifier configured to drive, when the write amplifier is activated, the input/output line in response to a first data signal supplied from the bus line;
a read amplifier including an input port and configured to drive, when the read amplifier is activated, the bus line in response to a second data signal supplied to the input port;
a relief memory element;
a first switch circuit connected between the input/output line and the input port of the read amplifier;
a second switch circuit connected between the input/output line and the relief memory element; and
a third switch circuit provided independently of each of the column switch circuit and the first and second switch circuits and connected between the relief memory element and the input port of the read amplifier.

21. The device as claimed in claim 20,
wherein the write amplifier is activated in response to a data write mode and the read amplifier is activated in response to a data read mode;
wherein each of the first, second and third switch circuits is turned OFF in response to the data write mode and to the selected one of the memory cells being not defective;
wherein each of the first and third switch circuits is turned OFF and the second switch circuit is turned ON in response to the data write mode and to the selected one of the memory cells being defective;
wherein each of the second and third switch circuits is turned OFF and the first switch circuit is turned ON in response to the data read mode and to the selected one of the memory cells being not defective; and
wherein each of the first and second switch circuits is turned OFF and the third switch circuit is turned ON in response to the data read mode and to the selected one of the memory cells being defective.

22. The device as claimed in claim 20,
wherein the write amplifier is activated in response to a first data write mode with assertion of data masking and deactivated in a second data write mode without assertion of data masking, and the read amplifier is activated in response to a data read mode;
wherein each of the first, second and third switch circuits is turned OFF in response to the first data write mode irrespective of whether the selected one of the memory cells is defective or not;
wherein each of the first, second and third switch circuits is turned OFF in response to the second data write mode and to the selected one of the memory cells being not defective;
wherein each of the first and third switch circuits is turned OFF and the second switch circuit is turned ON in response to the second data write mode and to the selected one of the memory cells being defective;
wherein each of the second and third switch circuits is turned OFF and the first switch circuit is turned ON in response to the data read mode and to the selected one of the memory cells being not defective; and
wherein each of the first and second switch circuits is turned OFF and the third switch circuit is turned ON in response to the data read mode and to the selected one of the memory cells being defective.

23. The device as claimed in claim 20, wherein each of the memory cells comprises a DRAM cell and the relief memory cell comprises a flip-flop circuit.

24. The device as claimed in claim 20, further comprising a first precharge circuit coupled to the input/output line and configured to precharge, when the first precharge circuit is activated, the input/output line, and a second precharge circuit coupled to the input port of the read amplifier and configured to precharge, when the second precharge circuit is activated, the input port of the read amplifier.

* * * * *